United States Patent [19]

Tennyson

[11] 4,348,643

[45] Sep. 7, 1982

[54] CONSTANT PHASE LIMITER

[75] Inventor: W. Richard Tennyson, Utica, N.Y.

[73] Assignee: General Electric Company, Utica, N.Y.

[21] Appl. No.: 204,091

[22] Filed: Nov. 5, 1980

[51] Int. Cl.[3] .......................... H03F 3/191; H03F 1/34
[52] U.S. Cl. .................................... 330/294; 330/302; 330/310
[58] Field of Search ............... 330/294, 302, 310, 296, 330/94, 284

[56] References Cited

U.S. PATENT DOCUMENTS

| 3,112,451 | 11/1963 | Collins | 328/155 |
| 3,581,122 | 5/1971 | Gaunt | 307/295 |
| 3,972,002 | 7/1976 | Aprille | 330/28 |
| 4,090,150 | 5/1978 | Vachenauer | 330/302 |

OTHER PUBLICATIONS

V. Padmanabhan, An AG C Amplifier for Long Pulse Amplification, J. Instn. Electronics & Telecom. Engrs., vol. 21, No. 11, 1975.

Primary Examiner—James B. Mullins
Assistant Examiner—Gene Wan
Attorney, Agent, or Firm—Stephen A. Young

[57] ABSTRACT

A constant phase limiter is disclosed utilizing cascaded RC coupled amplifiers with complex feedback. In the illustrative embodiment, five NPN transistors connected in a common emitter configuration are cascaded. The first stage is a signal conditioning amplifier for setting the limiting threshold. By harmoniously selecting the operating conditions for each of the other stages, an overall constant phase/limited output characteristic can be achieved for the desired range of input signal.

5 Claims, 7 Drawing Figures

CONSTANT PHASE LIMITER

BACKGROUND OF THE INVENTION

1. Field Of The Invention

The present invention relates to constant phase limiters and more specifically to one which comprises cascaded RC coupled amplifiers with complex feedback.

2. Description Of The Prior Art

The four different types of circuits that have been developed as constant phase limiters have utilized either a diode quad arrangement, cascaded differential amplifiers, cascaded RC coupled amplifiers or cascaded FET amplifiers. The diode quad arrangements have the disadvantages of being large and expensive, and those utilizing cascaded differential amplifiers have operated with an excessive phase shift problem.

Prior art cascaded RC coupled amplifiers have also been large and expensive and cascaded FET amplifier designs have experienced the excessive phase shift problem.

Accordingly, it is an object of the invention to provide a circuit which can overcome the aforementioned shortcomings of prior art constant phase limiters.

It is a further object of the invention to provide a constant phase limiter that is relatively simple, having lower cost and being more reliable than prior art circuits.

These and other objects of the present invention will become more fully apparent with reference to the following specification and drawings which relate to a preferred embodiment of the invention.

BRIEF DESCRIPTION OF THE DRAWINGS

The invention, together with further advantageous features thereof, will be better understood upon study of the following, more detailed specifications of which the appended claims, abstract and accompanying drawings, form a part, when considered together with the accompanying drawings, in which:

SUMMARY OF THE INVENTION

The constant phase limiter according to the present invention is characterized by a plurality of cascaded RC coupled amplifiers with complex feedback. In the illustrative embodiment, five NPN transistors connected in a common emitter configuration are cascaded. The first stage is a signal conditioning amplifier for setting overall gain and the limiting threshold. Each of the next four stages are characterized by a series connected resistance and inductance in the emitter circuit. By harmoniously selecting the operating conditions of each stage of the present invention, the overall constant phase limited output characteristic for the desired range of input signals can be achieved.

DESCRIPTION OF THE PREFERRED EMBODIMENT

Figure 1:
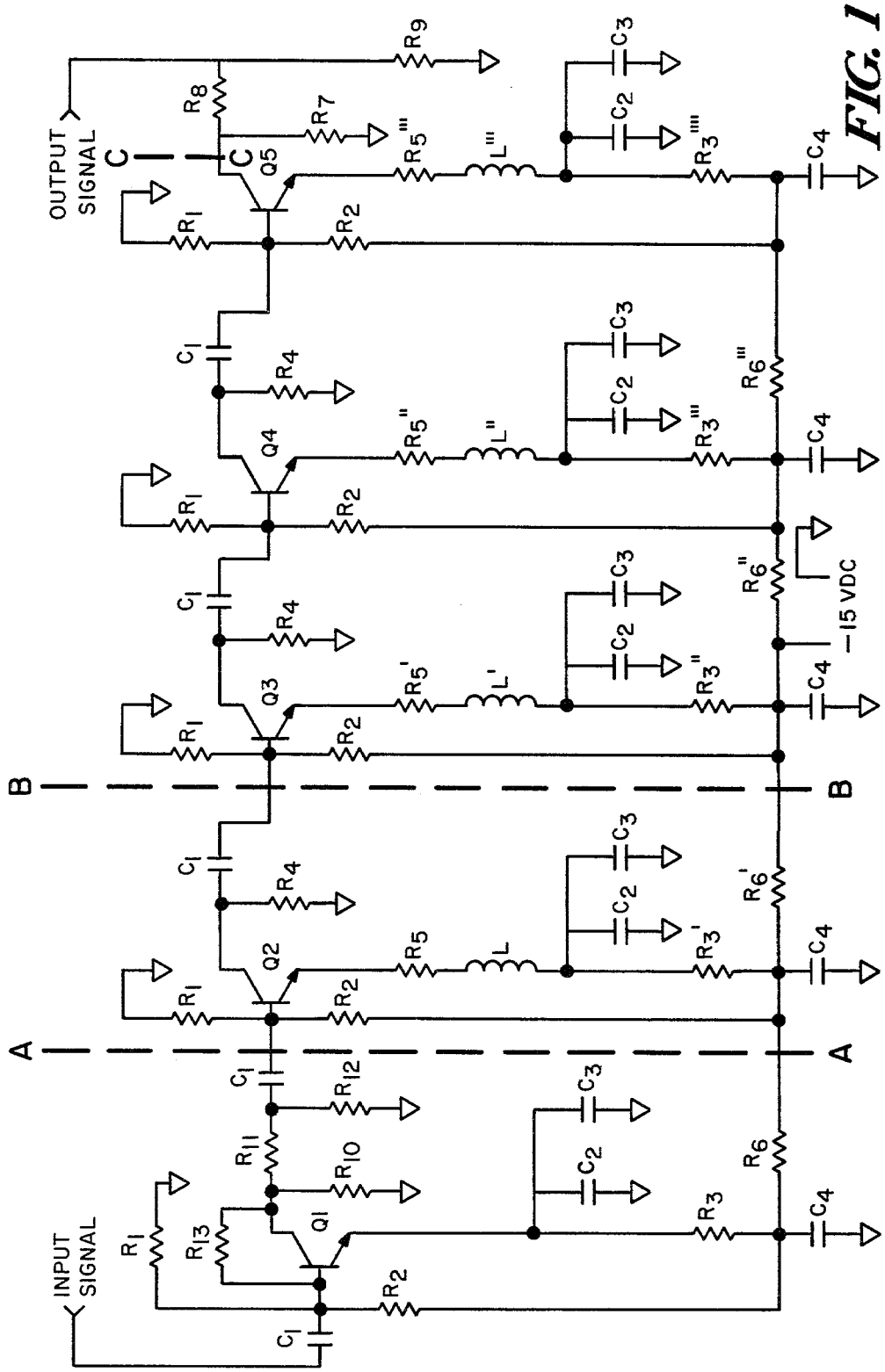
FIG. 1 is a schematic diagram of the present invention with an appropriate input and output circuit.

Referring now to the drawings, and more specifically to FIG. 1 thereof, there is shown a schematic diagram of the invention.

Each cascaded portion of the invention, that is each stage associated with transistors $Q_2$, $Q_3$ and $Q_4$ functions to extend the dynamic range of the limiter. Once the output limiting level of the limiter has been specified, the stages involving $Q_2$ through $Q_4$ have at least one optimal operating point at which to provide a constant phase characteristic.

FIG. 2 illustrates the transfer characteristics of a single stage in the limiter circuitry, such as the first stage between section A—A and B—B. Changes in DC operating point, RF load impedance, the transistor itself, feedback resistance and inductance all cause a variation in the single stage transfer characteristics (amplitude and phase). FIGS. 2a, 2b, 2c, 2d and 2e indicate the magnitude of those changes. By harmoniously selecting these operating conditions for each stage, an overall constant phase limited output characteristic can be achieved for the desired range of input signal levels.

Figures 2A, 2B:
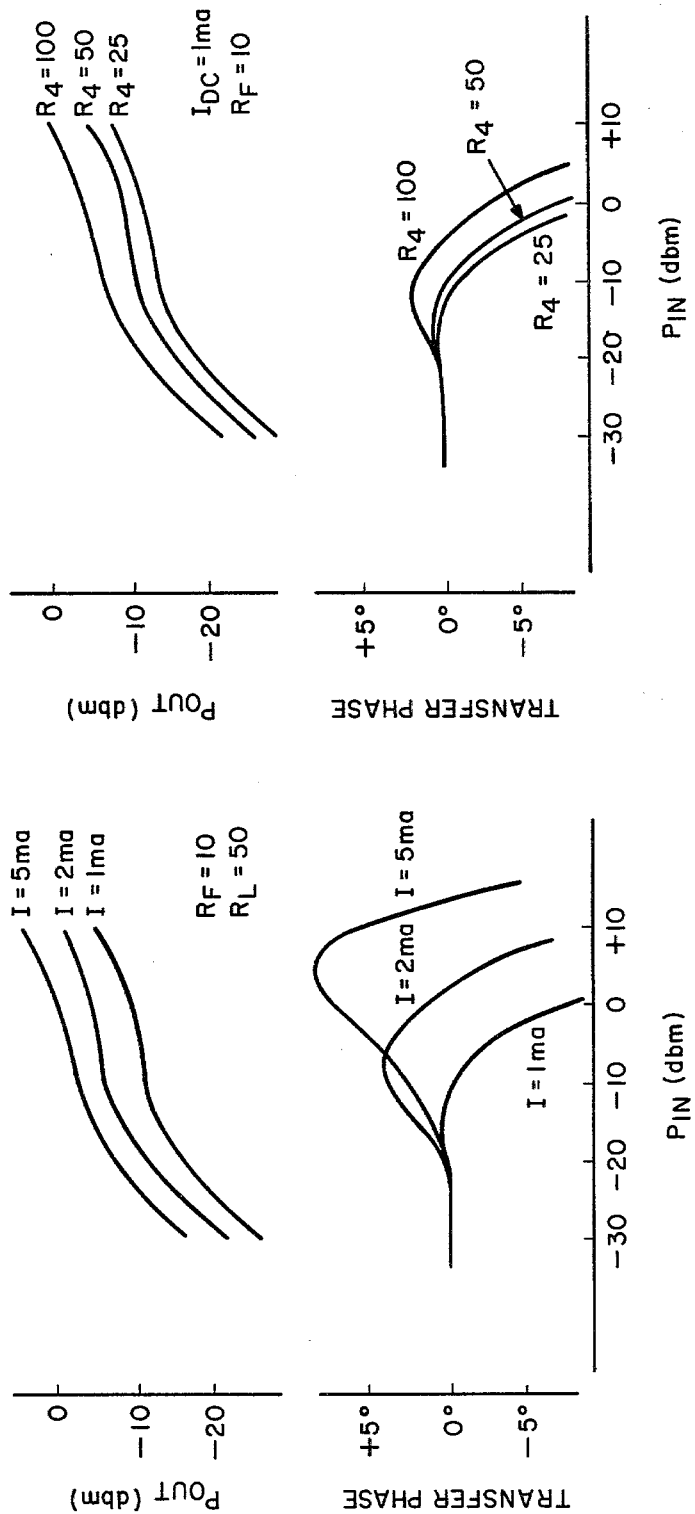
FIGS. 2a–2e include a number of transfer characteristics of a single stage of the present invention.

More specifically referring to the first stage, a bias voltage must be applied to the base of Q2 which effectively applies a voltage to the emitter in the configuration of a grounded collector (grounded in a DC sense). The biasing is established by resistors R1 and R2 acting as a voltage divider with respect to the −15 volts supply voltage, and the selection of emitter resistor R3 which sets the emitter current. It is important to have the collector to emitter voltage above some low value on the order of 5 volts. FIG. 2a shows the emitter current to be quite critical since large phase variations occur for various changes in emitter current. Since the magnitude of resistor R3 is so much larger than the magnitude of resistor R5, resistor R5 has only a second order effect upon the emitter current.

Resistor R4 provides the RF load. The family of curves in FIG. 2b shows the amplitude and phase variations of the first stage as the value of the RF load varies from 25 to 100 ohms. Actually the RF load is resistor R4 in combination with the input impedance of the following stage. However, in selecting a value of resistor R4 that will be harmoniously related to the other four parameters to be selected, the characteristics shown in FIG. 2b can be utilized without taking into account subsequent input impedances.

Figure 2D:
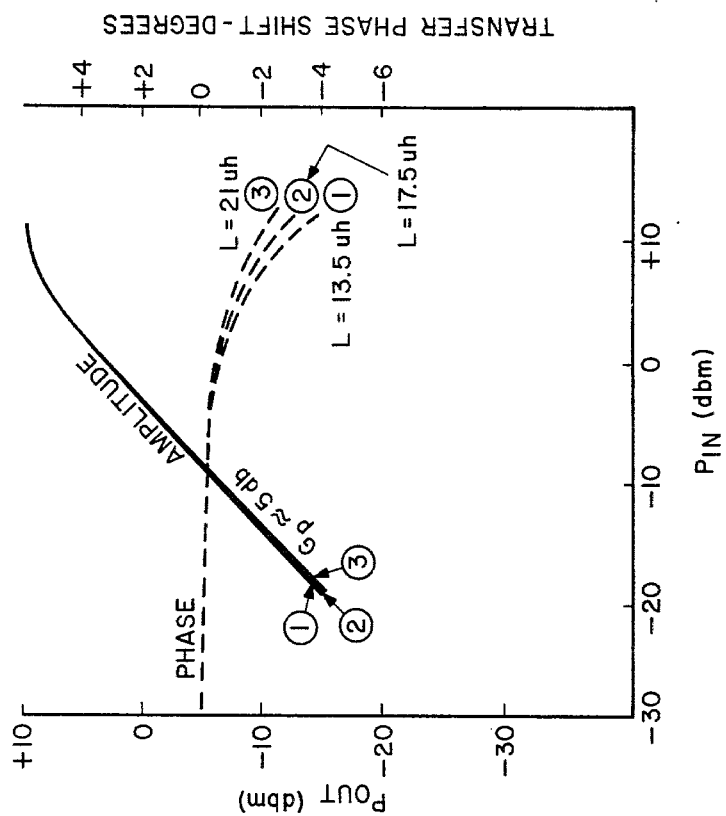
Figure 2C:
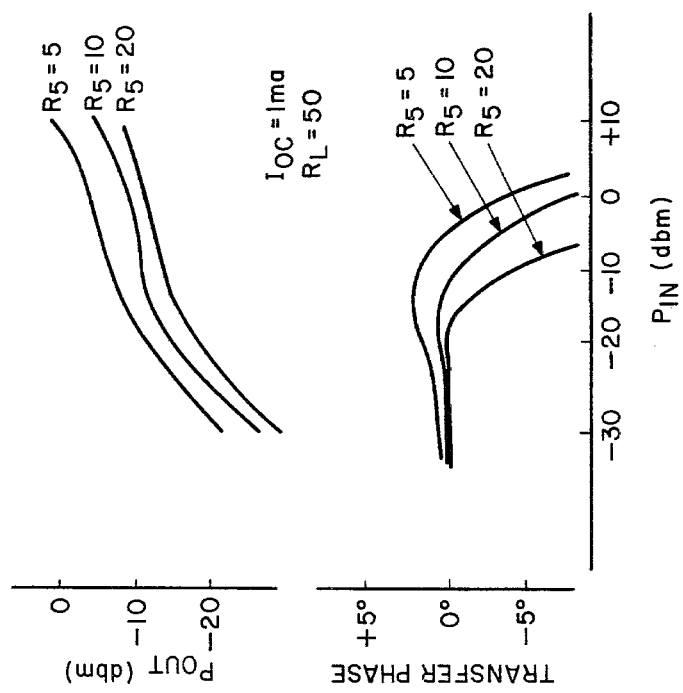

The effects of variations in the feedback resistor R5, and the feedback inductor L are illustrated in FIG. 2c and 2d, respectively.

Figure 2E:
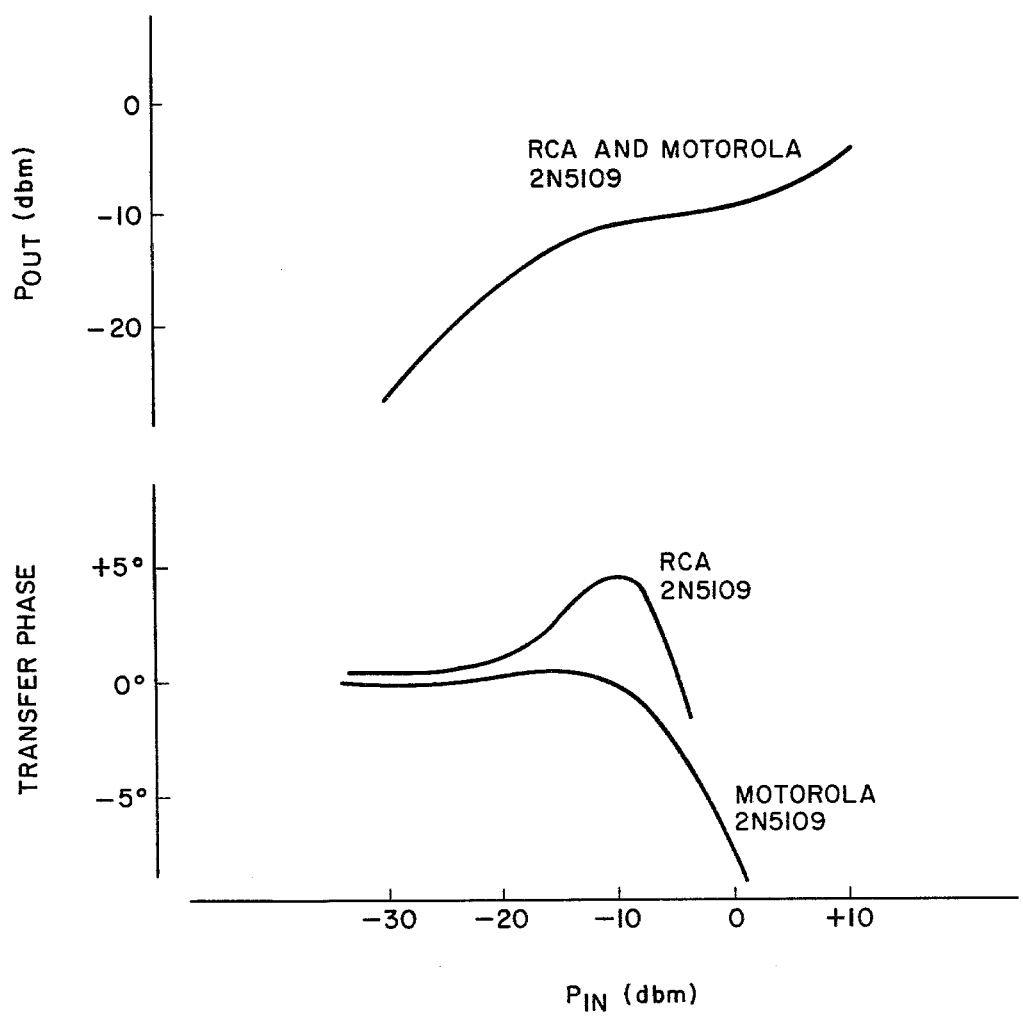

FIG. 2e illustrates the amplitude and phase characteristics of two different transistors.

Capacitor C1 is a coupling capacitor that functions with biasing resistors R1 and R2 in order to set the collector to emitter voltage at approximately 5 volts.

Capacitors C2 and C3 are high and low frequency broadband bypass capacitors that also function to maintain stability within each stage of the limiter.

The input circuitry shown to the left of section A—A functions as a conditioning circuit in order to either attenuate or amplify the input so that it will be compatible with the level that is required at the base of Q2. The circuit shown includes an amplifier (Q1) and an attenuator. The pi network of resistors R10, R11 and R12 functions to attenuate the input signal to a compatible level, and to buffer the input conditioning stage from the first limiting stage (Q2).

In a similar fashion, the circuitry shown to the right of section C—C functions to reduce the 10 dbm limited output signal from the last stage to a 0 dbm limited level. The pi network including resistors R7, R8 and R9 provides this attenuation feature. The 10 db Pi network may be designed for any desired attenuation to set the limited output level to any arbitrary level to suit the application.

In order to increase the dynamic range of the limiter, several stages can be cascaded. As each additional stage is added, the dynamic range increases by approximately 8 db. The only difference in component values between stages is the value of the feedback resistor and inductor because the load impedance changes slightly as additional stages are added. However, after the third stage (involving Q4), a point is reached where if additional stages are required to increase the dynamic range, all stage components will be equal to those of the Q4 stage.

While this invention is not limited to any particular circuit parameters or number of stages, the following are incorporated in an embodiment of this invention designed for operation at 70 megahertz, successfully tested and reduced to practice in lumped element form, and they are listed as an aid to reconstructing this invention.

| | |
|---|---|
| Resistor R1 | 5,100 ohms |
| Resistor R2 | 10,000 ohms |
| Resistor R3 | 430 ohms |
| Resistor R3',R3",R3''',R3'''' | 6,200 ohms |
| Resistor R4 | 51 ohms |
| Resistor R5 | 24 ohms |
| Resistor R5',R5",R5''' | 12 ohms |
| Resistor R6, R6', R6", R6''' | 10 ohms |
| Resistor R7, R9, R10, R12 | 100 ohms |
| Resistor R8 | 62 ohms |
| Resistor R11 | 75 ohms |
| Resistor R13 | 1,100 ohms |
| Capacitor C1, C2 | .001 uf |
| Capacitor C3, C4 | .01 uf |
| Inductor L | 20 nanohenries |
| Inductor L | 15 nanohenries |
| Inductor L', L''' | 13 nanohenries |
| Transistor Q1 | Motorola MRF904 |
| Transistors Q2, Q3, Q4, Q5 | Motorola 2N5109 |

The invention has also been reduced to practice in a hybrid microelectronic circuit form and functions approximately identical to the lumped element form.

Figure 3:
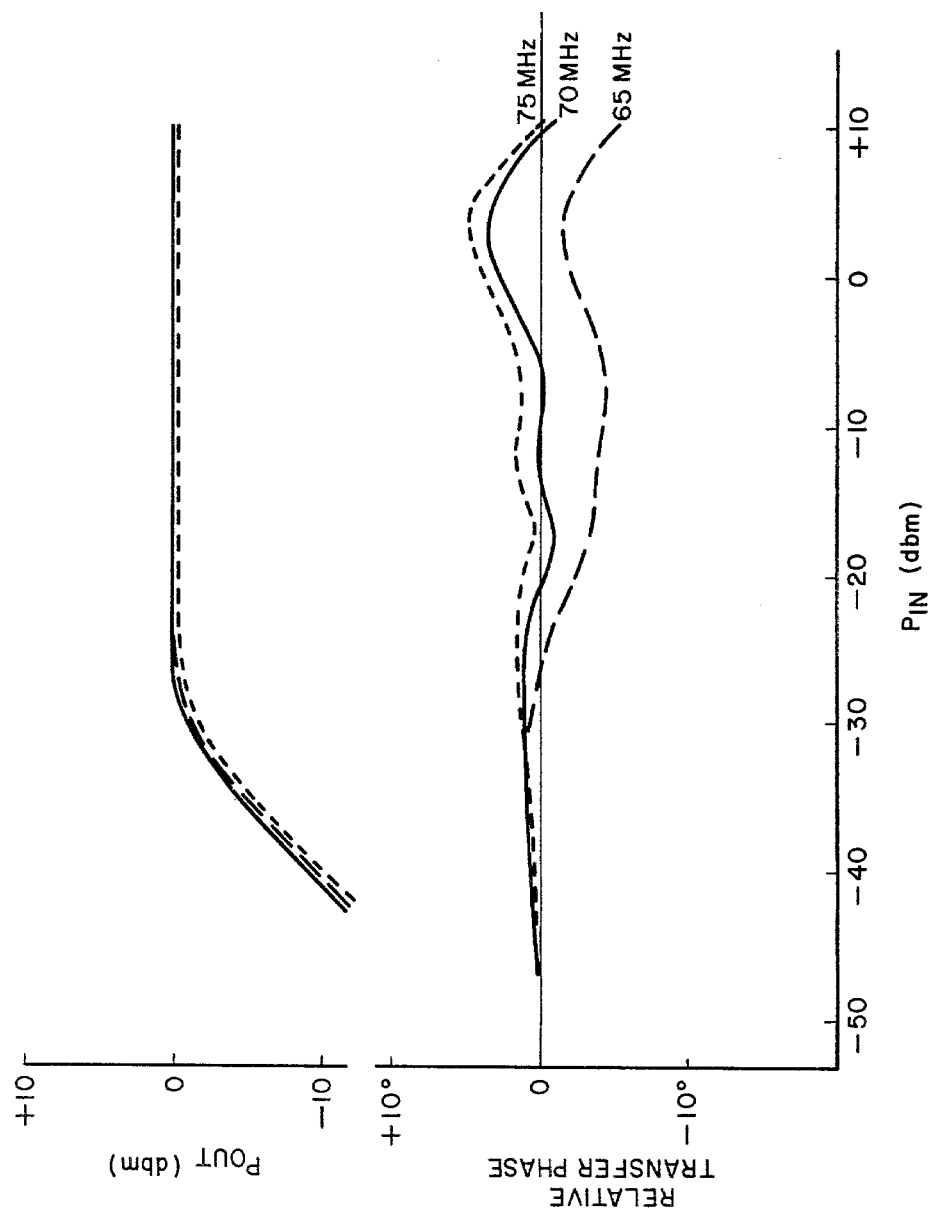
FIG. 3 illustrates the performance characteristics of the present invention shown in FIG. 1 in terms of output power and phase.

FIG. 3 illustrates that the unique circuit configuration shown in FIG. 1 provides constant phase limiting over a 30 db input RF signal dynamic range and over a signal bandwidth of 10 MHz centered at a nominal 70 MHz. The invention has also been configured to include nine stages that provide constant phase limiting over a 60 db input dynamic range at 70 megahertz.

While a preferred embodiment of the invention has been shown and described, various other embodiments and modifications thereof will become apparent to persons skilled in the art, and will fall within the scope of invention as defined in the following claims.

I claim:
1. A constant phase limiter comprising:

(a) a plurality of substantially identical cascaded transistor stages, each of said stages including a transistor having a base, an emitter, and a collector electrode and having an input circuit between said base and said emitter electrode, and an output circuit between said emitter and said collector electrode;
(b) an impedance means having a first end and a second end, said first end being connected to said emitter electrode;
(c) a first bias means having a first end and a second end, said first end being connected to said second end of said impedance means;
(d) a first bypass means having a first and a second end, said first end being connected to said second end of said impedance means, and having said second end being connected to a reference potential;
(e) a second bias means having a first and a second end, said first end being connected to said base electrode and having said second end being connected to said second end of said first bias means;
(f) a third bias means having a first and a second end, said first end being connected to said base electrode and having said second end being connected to a reference potential;
(g) a loading means having a first and a second end, said first end being connected to said collector electrode and having said second end being connected to a reference potential;
(h) a coupling capacitor means having a first and a second end, said first end being connected to said collector electrode and having said second end being a first terminal of the output circuit;
(i) a decoupling means having a first and a second end, said first end being connected to said second end of said first bias means and having said second end being connected to a second terminal of the output circuit;
(j) a bypass and decoupling means having a first and a second end, said first end being connected to said second end of said first bias means and having said second end being connected to a reference potential; and
(k) said impedance means further comprising a feedback resistor and a feedback inductor chosen so as to provide an overall constant phase limited output characteristic for a desired range of input signal levels.

2. The constant phase limiter described in claim 1 wherein said coupling capacitor means cooperates with said second and third bias means to establish a satisfactory collector to emitter operating voltage.

3. The constant phase limiter described in claim 1 wherein said first bias means sets a satisfactory emitter current through said transistor.

4. The constant phase limiter described in claim 1 which comprises a first stage having an loading means further comprising a pi network of resistors so as to perform an attenuation function.

5. The constant phase limiter described in claim 1 or 4 which comprises a last stage having a loading means further comprising a pi network of resistors so as to perform an attenuation function.

* * * * *